United States Patent
Min et al.

(10) Patent No.: US 8,791,767 B2
(45) Date of Patent: Jul. 29, 2014

(54) PACKAGE INDUCTANCE COMPENSATING TUNABLE CAPACITOR CIRCUIT

(75) Inventors: ByungWook Min, San Antonio, TX (US); Der-Woei Wu, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 569 days.

(21) Appl. No.: 12/916,338

(22) Filed: Oct. 29, 2010

(65) Prior Publication Data

US 2012/0105167 A1 May 3, 2012

(51) Int. Cl.
*H03H 7/00* (2006.01)

(52) U.S. Cl.
USPC ............................ 333/17.1; 333/167; 333/174

(58) Field of Classification Search
USPC .......... 333/17.1, 24 C, 32, 33, 132, 167, 174, 333/204, 205, 235; 257/664, 665
See application file for complete search history.

(56) References Cited

U.S. PATENT DOCUMENTS

| | | |
|---|---|---|
| 4,107,728 A | 8/1978 | Max |
| 6,681,102 B1 * | 1/2004 | Collier et al. ................. 455/296 |
| 7,071,799 B2 * | 7/2006 | Behzad ............................. 334/56 |
| 2005/0040909 A1 * | 2/2005 | Waight et al. ................. 333/17.1 |
| 2009/0039986 A1 * | 2/2009 | Kamgaing et al. .......... 333/24 C |
| 2009/0236701 A1 | 9/2009 | Sun et al. |

FOREIGN PATENT DOCUMENTS

| | | |
|---|---|---|
| WO | 0150531 A1 | 7/2001 |
| WO | 2005078916 A1 | 8/2005 |

OTHER PUBLICATIONS

International Search Report and Written Opinion—PCT/US2011/058152—ISA/EPO—Jun. 21, 2012.

* cited by examiner

*Primary Examiner* — Robert Pascal
*Assistant Examiner* — Kimberly Glenn
(74) *Attorney, Agent, or Firm* — William M. Hooks

(57) ABSTRACT

An integrated circuit (IC) for compensating for a package inductance is disclosed. A first ground pad is directly connected to an on-chip ground node. A second IC ground pad is connected to the on-chip ground node via a tunable capacitor circuit, where the capacitance of the tunable capacitor circuit resonates with the package inductance at the operating frequency of the IC.

41 Claims, 11 Drawing Sheets

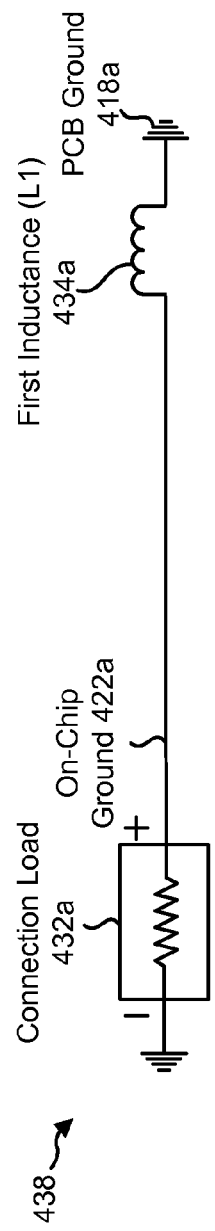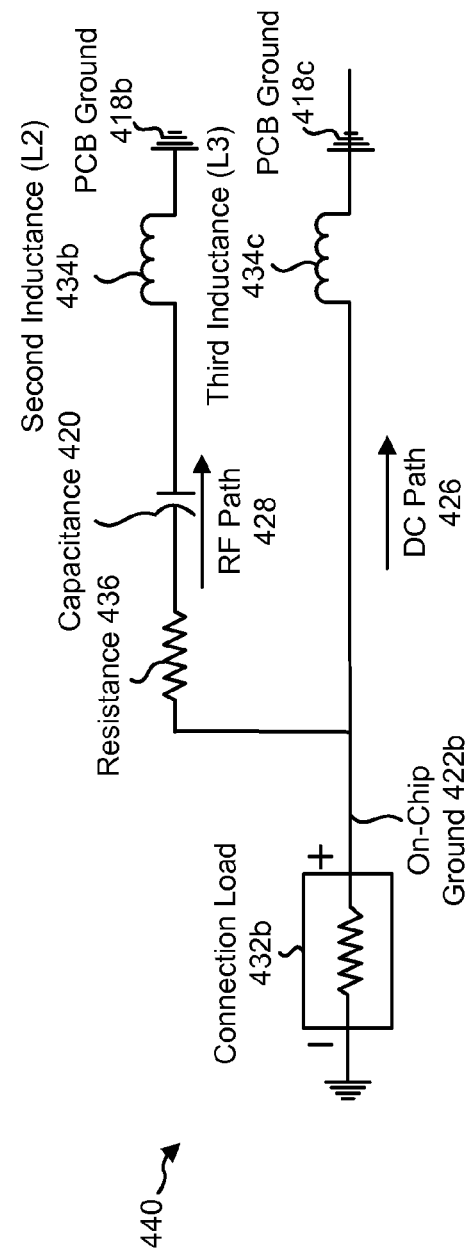

PACKAGE INDUCTANCE COMPENSATING TUNABLE CAPACITOR CIRCUIT

TECHNICAL FIELD

The present disclosure relates generally to electronic devices for communication systems. More specifically, the present disclosure relates to a package inductance compensating tunable capacitor circuit.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data, and so on. These systems may be multiple-access systems capable of supporting simultaneous communication of multiple wireless communication devices with one or more base stations.

For proper reception and transmission of wireless signals on a wireless communication network, a wireless communication device may use one or more radio frequency (RF) communication circuits. Wireless communication device and/or wireless communication system specifications may require that the amplitude of signals generated within wireless communication devices meet certain requirements while also maintaining high levels of reliability. In addition, a wireless communication device may operate using batteries. Therefore, benefits may be realized by providing improvements to RF circuits.

SUMMARY

An integrated circuit (IC) for compensating for a package inductance is disclosed. A first ground pad is directly connected to an on-chip ground node. A second IC ground pad is connected to the on-chip ground node via a tunable capacitor circuit, where the capacitance of the tunable capacitor circuit resonates with the package inductance at the operating frequency of the IC.

In one configuration, a printed circuit board (PCB) ground node may be connected to the first integrated circuit (IC) pad and the second IC pad, and the package inductance is from the connection between the second IC pad and the PCB ground node. An impedance of the on-chip ground may be lower at the operating frequency of the integrated circuit when the tunable capacitor circuit resonates with the package inductance than without the tunable capacitor circuit.

The tunable capacitor circuit may include a fixed capacitor in parallel with a switched capacitor. The switched capacitor may include a switch in series with a capacitor, and the switch may operate to include or exclude a capacitance of the capacitor from the tunable capacitor bank based on a control voltage.

In one configuration, the switch may be a transistor. Furthermore, the switch may be an n-type metal-oxide-semiconductor (NMOS) field effect transistor. The tunable capacitor circuit may include a plurality of switched capacitors in parallel with each other and in parallel with the fixed capacitor. The capacitance of the capacitors in the switched capacitors may increase according to a binary bit increment and the switch-on resistance of the transistors in the switched capacitors increases according to a binary bit increment.

An apparatus for compensating for a package inductance is also disclosed. The apparatus includes a first integrated circuit (IC) ground pad directly connected to an on-chip ground node. The apparatus also includes a second IC ground pad connected to the on-chip ground node via a tunable capacitor circuit, and a capacitance of the tunable capacitor circuit resonates with a package inductance at an operating frequency of the IC.

An apparatus for compensating for a package inductance is also disclosed. The apparatus includes a first means for connecting an integrated circuit (IC) that is directly connected to an on-chip ground node. The apparatus also includes a second means for connecting an IC that is connected to the on-chip ground node via a tunable capacitive means, wherein a capacitance of the tunable capacitive means resonates with a package inductance at an operating frequency of the IC.

A method for compensating for a package inductance is also disclosed. A first integrated circuit (IC) pad is connected directly to an on-chip ground node. A second IC pad is connected to the on-chip ground node via a tunable capacitor circuit, and a capacitance of the tunable capacitor circuit resonates with a package inductance at an operating frequency of the IC.

BRIEF DESCRIPTION OF THE DRAWINGS

FIG. 4a is a circuit diagram illustrating a circuit with a single on-chip ground to printed circuit board (PCB) ground connection that does not include a package inductance compensating tunable capacitor circuit;

FIG. 4b is a circuit diagram illustrating one configuration of a circuit with a dual connection between the on-chip ground and the PCB ground;

DETAILED DESCRIPTION

Figure 1:
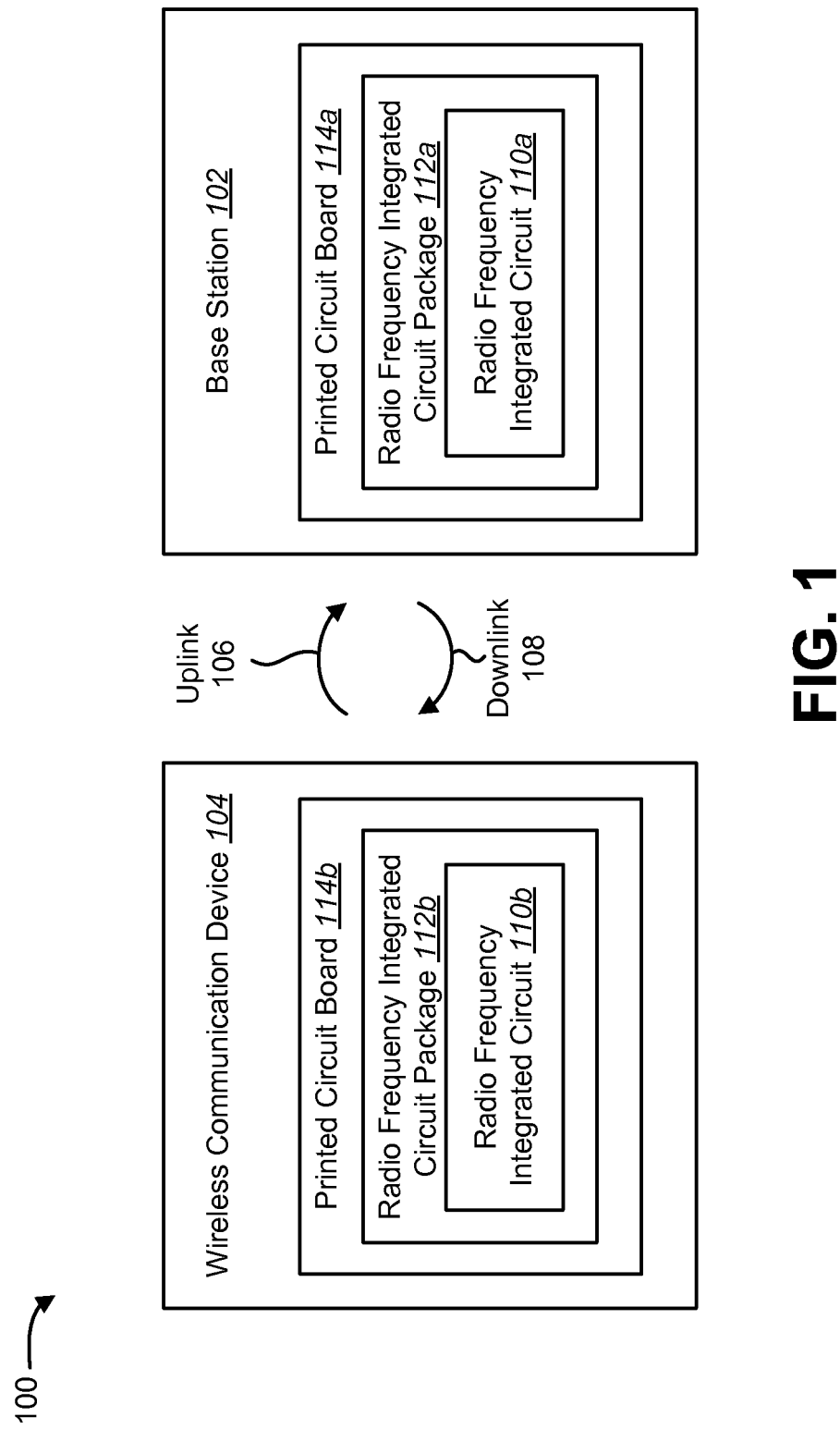
FIG. 1 is a block diagram illustrating a wireless communication system.

FIG. 1 is a block diagram illustrating a wireless communication system 100. A base station 102 may communicate with one or more wireless communication devices 104. The base station 102 may also be referred to as, and may include some or all of the functionality of, an access point, a broadcast transmitter, a Node B, an evolved Node B, etc. Each base station 102 may provide communication coverage for a particular geographic area.

A wireless communication device 104 may be referred to as, and may include some or all of the functionality of, a terminal, an access terminal, a user equipment (UE), a mobile device, a subscriber unit, a station, etc. The wireless communication device 104 may be a cellular phone, a personal digital assistant (PDA), a wireless device, a wireless modem, a handheld device, a laptop computer, etc. The wireless communication device 104 may communicate with zero, one, or multiple base stations 102 on the downlink (DL) 108 and/or uplink (UL) 106 at any given moment using an antenna. The downlink 108 (or forward link) refers to the communication link from a base station 102 to the wireless communication device 104, and the uplink 106 (or reverse link) refers to the communication link from the wireless communication device 104 to the base station 102.

The wireless communication device 104 and the base station 102 may have one or more radio frequency (RF) integrated circuits (ICs) 110a-b. For example, the RF integrated circuit 110a-b may be an RF amplifier or an RF transmit/receive switch. The RF integrated circuit 110a-b may be in an RF integrated circuit package 112a-b that is attached to a printed circuit board (PCB) 114a-b. When an RF integrated circuit package 112a-b is added to a printed circuit board 114b, it may be desirable to have a "good" ground connection between the IC ground pad and the PCB ground, i.e., the connection between the IC ground pad and the PCB ground introduces little or no chip-side impedance at operating frequencies. The IC ground pad may be connected to the PCB ground using wire bonding or the flip chip method. However, both of these connection types may create some parasitic inductance that increases ground impedance proportionally with the operating frequency of the RF integrated circuit 110a-b. This ground impedance may lower the power gain in RF amplifiers. RF switches, such as transmit/receive switches, may have low RF isolation due to the ground inductance. Therefore, it may be desirable to extend the PCB ground to the RF integrated circuit 110a-b in a way that minimizes the impedance of the parasitic inductance of the IC ground pad to PCB ground connection. In other words, it may be desirable to minimize the ground inductance effect and account for the inductance variation.

The wireless communication system 100 may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems, and spatial division multiple access (SDMA) systems.

Figure 2:
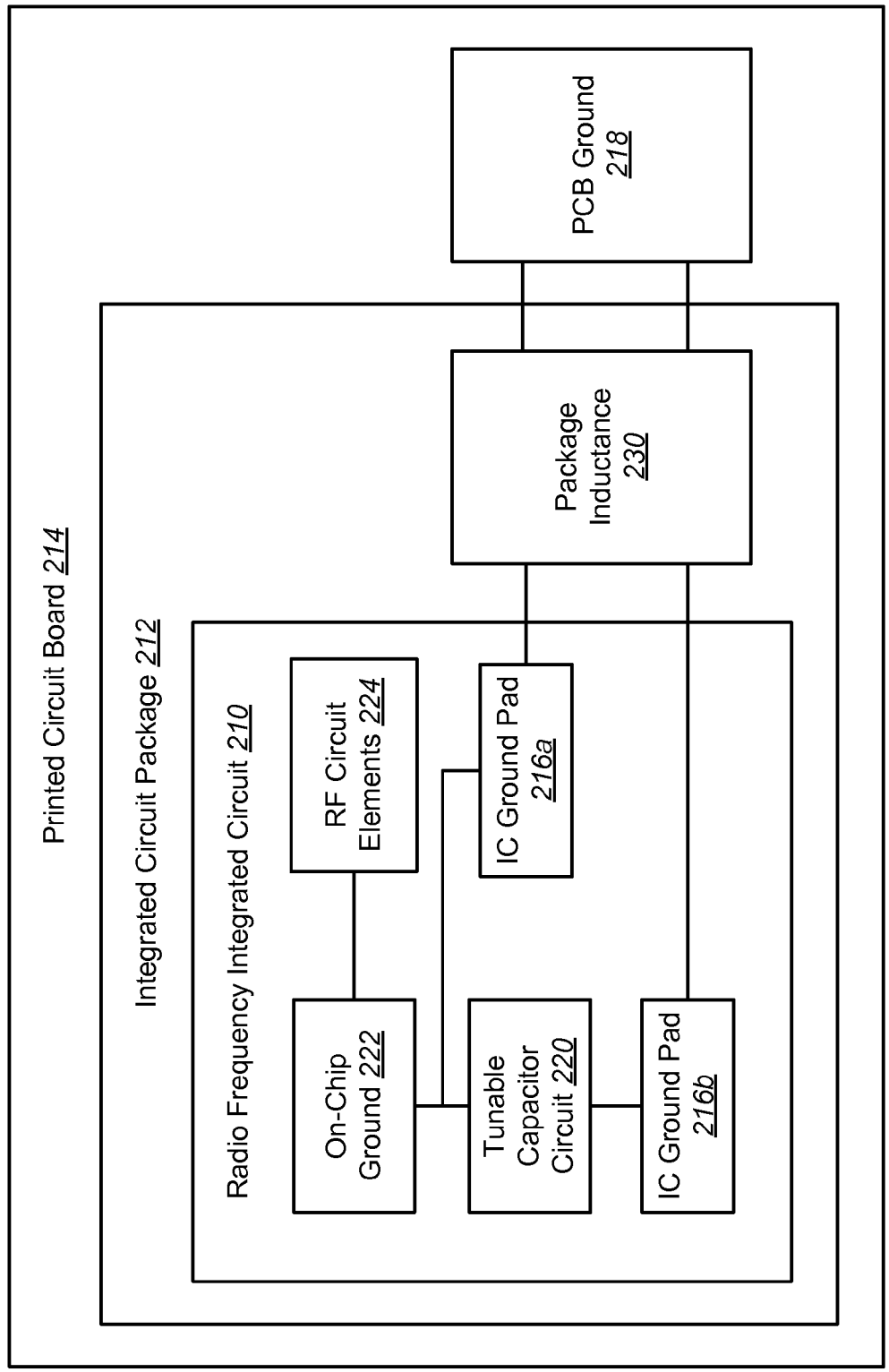
FIG. 2 is a block diagram illustrating a package inductance compensating tunable capacitor circuit.

FIG. 2 is a block diagram illustrating a package inductance 230 compensating tunable capacitor circuit 220. As before, an integrated circuit package 212 that includes an RF integrated circuit 210 may be connected to a printed circuit board 214. The RF integrated circuit 210 may include RF circuit elements 224, e.g., transistors, resistors, capacitors, etc. For example, these RF circuit elements 224 may combine to form an RF amplifier, an RF transmit/receive switch, or another type of circuit that operates using a radio frequency. The present systems and methods may be tunable and implemented on the chip side, i.e., without modification to a PCB. In one configuration, the present systems and methods may not require a biasing diode or a negative voltage bias.

A strong ground connection from the integrated circuit 210 to the PCB 214 may minimize the package inductance 230, i.e., the inductance between the IC ground pads 216a-b and the PCB ground 218. As the IC chip 210 size increases and the operating frequency of the IC 210 increases, the package inductance 230 (from the IC ground pads 216a-b to PCB ground 218) may degrade the IC 210 performance more significantly. The present systems and methods may compensate for the package inductance 230 of the connection to ground using a tunable capacitor circuit 220 between the on-chip ground 222 and one of the IC ground pads 216b. This tunable capacitor circuit 220 may include multiple switched capacitors that operate to produce a specific capacitance. The capacitors in the tunable capacitor circuit 220 may be included or excluded from the RF integrated circuit 210 using switches, e.g., each capacitor may be in series with a transistor that switches the capacitor in or out of the RF integrated circuit 210.

The package inductance 230 may vary 0.3 nH to 2 nH depending on the connection type between the IC ground pads 216a-b and the PCB ground 218, e.g., a bonding wire or a flip-chip bump. This package inductance 230 for an RF circuit ground may have a negative impact on the circuit performance. For example, the ground inductance, or package inductance 230, in an RF amplifier may lower the power gain and the stability margin. RF switches, such as a transmit/receive switch, may have low RF isolation due to the ground inductance. Additionally, the package inductance 230 may be unpredictable due, in part, to significant process variation in the package process.

Figure 3:
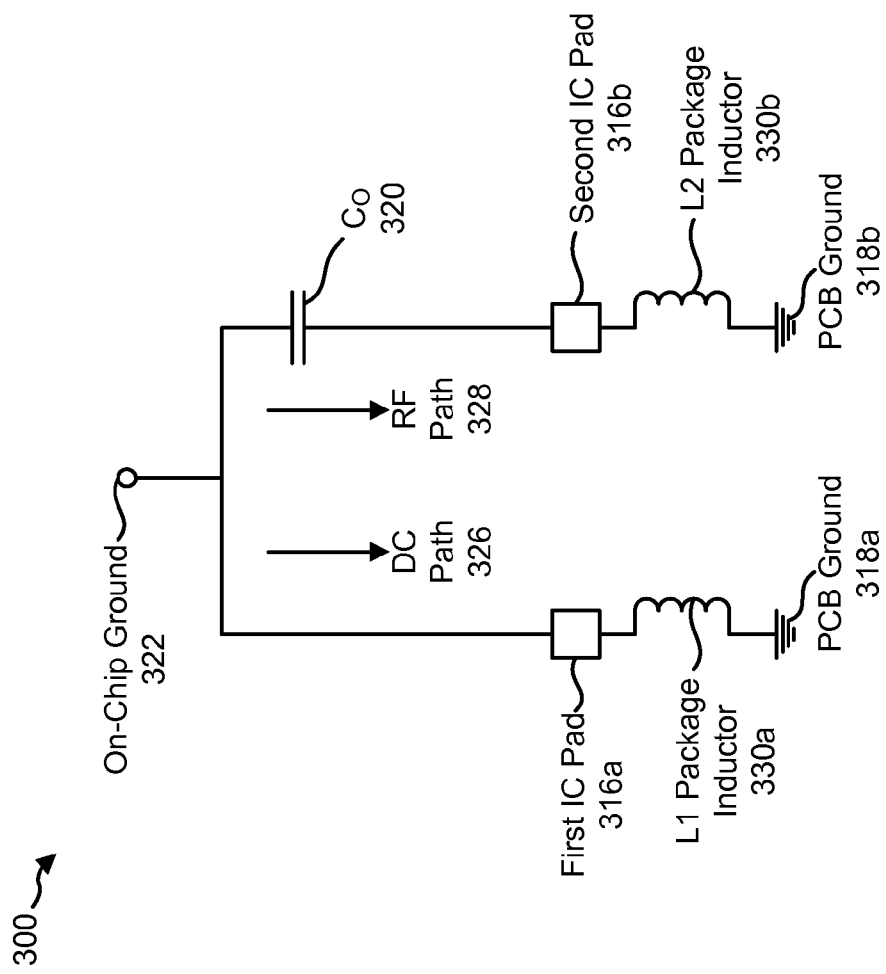
FIG. 3 is a circuit diagram illustrating a package inductance compensating tunable capacitor circuit.

FIG. 3 is a circuit diagram illustrating a package inductance compensating tunable capacitor circuit 300. The circuit 300 may include two integrated circuit (IC) pads 316a-b for the connection from the on-chip ground 322 to the PCB ground 318a-b. The first IC pad 316a may be directly connected to the PCB ground 318a, i.e., forming a direct current (DC) path 326. The second IC pad 316b may be connected to PCB ground 318b through one or more capacitors 320 to form a radio frequency (RF) path 328. The DC path 326 may include a first package inductance, L1 330a, and the RF path 328 may include a second package inductance, L2 330b. Although shown as a single capacitor, $C_0$ 320, the capacitance may be created by a tunable capacitor, e.g., a switched capacitor bank. The on-chip capacitor ($C_0$) 320 may be selected to resonate with the second package inductance, L2 330b, at the operating frequency (we), according to Equation (1):

$$C_0 = \frac{1}{(L2 * w_0^2)} \quad (1)$$

The impedance of the on-chip ground 322 through the RF path 328 may be described by Equation (2):

$$Z_0 = jwL2 + \frac{1}{jwC_0} = j\left(w - \frac{w_0^2}{w}\right) * L2 \quad (2)$$

Therefore, the impedance of the on-chip ground 322, $Z_0$, may be zero at the operating frequency ($w_0$) of the integrated circuit, i.e., the on-chip ground 322 becomes ideal at the operating frequency ($w_0$).

FIG. 4a is a circuit diagram illustrating a circuit 438 with a single on-chip ground 422a to printed circuit board (PCB) ground 418a connection that does not include a package inductance compensating tunable capacitor circuit. In other words, an IC ground pad may connect to the PCB ground 418a using wire bonding or flip chip bumps, which may introduce a first parasitic inductance (L1) 434a. Possible values for the first inductance (L1) 434a may be 0.3 nH to 2 nH, depending on the type of connection used. The connection may include a connection load 432a. The connection load 432a may represent the ground impedance, i.e., it may be considered the simplified model of the RF circuit elements illustrated in FIG. 2. Without a package inductance compensating tunable capacitor circuit, the impedance of this connection at an operating frequency (e.g., 2.4 GHz) may be relatively high. In other words, the connection may have a higher impedance, at an operating frequency, without a tunable capacitor circuit than with one. The chip-side impedance may increase linearly with the operating frequency.

FIG. 4b is a circuit diagram illustrating one configuration of a circuit 440 with a dual connection between the on-chip ground 422b and the PCB ground 418b-c. This circuit 440 may include a connection load 432b, an RF path 428 and a DC path 426. The connection load 432b may represent the ground impedance, i.e., it may be considered the simplified model of the RF circuit elements illustrated in FIG. 2. The circuit 440 may include a package inductance compensating tunable capacitor circuit, i.e., the capacitance 420 may resonate with the second inductance (L2) 434b in the RF path 428 at an operating frequency of the IC. This may reduce the on-chip ground 422b impedance. The capacitance 420 may be produced with a tunable capacitor circuit that includes one or more transistors. The resistance of the transistor switches used to produce the capacitance 420 is modeled as a resistor 436 in the RF path 428. Thus, when the capacitance 420 resonates with the second inductance (L2) 434b in the RF path 428 at the operating frequency of the IC, the impedance to an operating frequency may be lower than without the capacitance 420. Furthermore, the DC path 426 may present relatively low impedance to a DC signal, despite the third inductance (L3) 434c in the DC path 426. Possible values for the second inductance (L2) 434b and third inductance (L3) 424c may be 0.3 nH to 2 nH, depending on the type of connection used. Possible values for the capacitance 420 and resistor 436 may be 9 pF and 1 Ohm, respectively.

Figure 5:
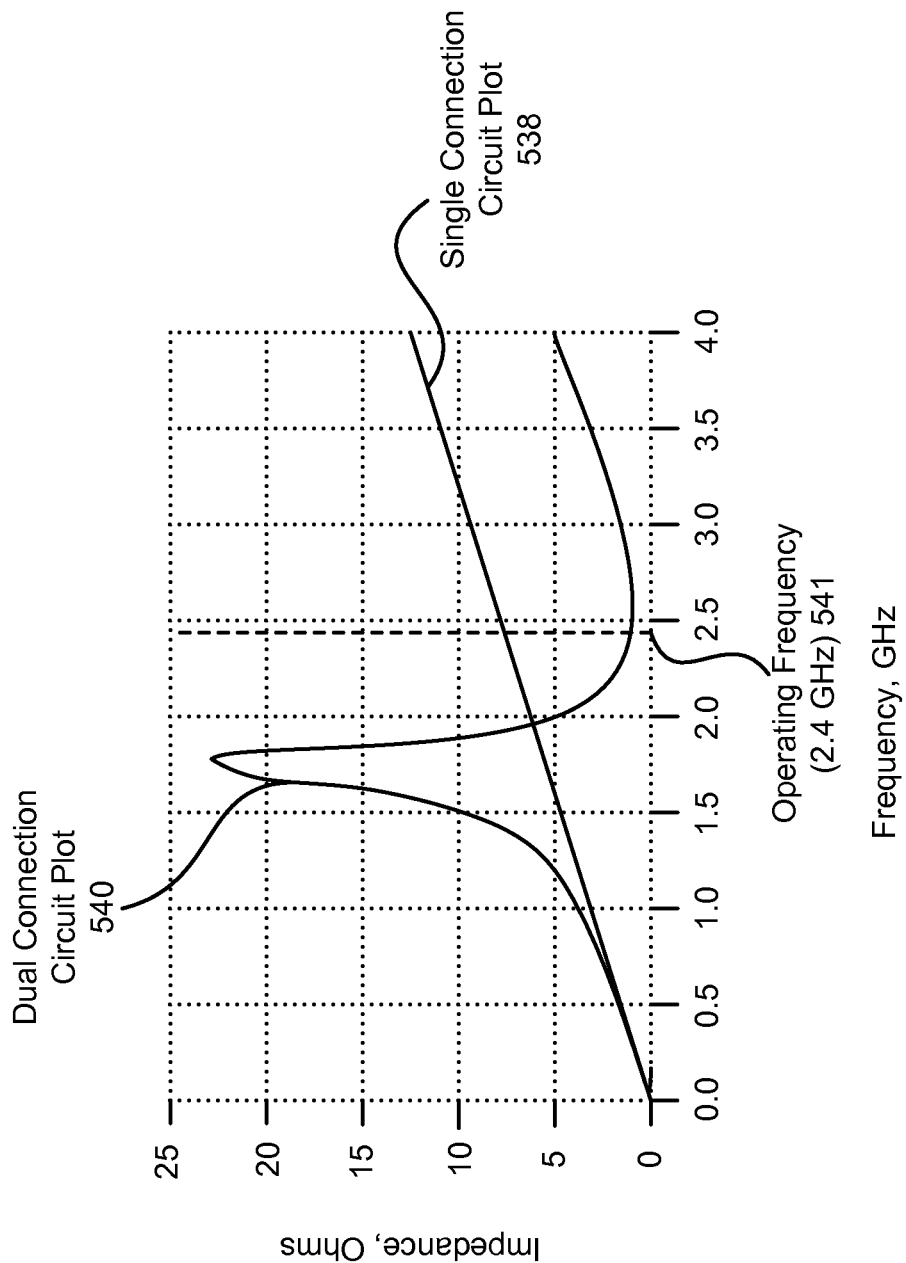
FIG. 5 is a plot illustrating impedance as a function of the operating frequency of the on-chip ground of an RF circuit.

FIG. 5 is a plot illustrating impedance as a function of the operating frequency of the on-chip ground of an RF circuit. Specifically, a single connection circuit plot 538 may correspond to the single connection circuit 438 illustrated in FIG. 4A. Likewise, a dual connection circuit plot 540 may correspond to the dual connection circuit 440 illustrated in FIG. 4. The package inductance 434a-c are modeled as 0.5 nH and the resistance 436 is modeled as 1 Ohm for the plots. The impedance of the single connection circuit plot 538 may increase linearly with the operating frequency. The impedance of the ground connection at an operating frequency (e.g., 2.4 GHz) 541 may be about 7.54 Ohms. In contrast, the impedance of the dual connection circuit plot 540 may not increase linearly, but may resonate at about the operating frequency (e.g., 2.4 GHz) 541, thus reducing the impedance of the on-chip ground at the operating frequency 541 to about 1.076 Ohms. This resonating may be caused by the capacitance 420 in the RF path 428. In this sense, a capacitor bank may be tuned to the operating frequency 541, i.e., causing a low on-chip ground impedance at the operating frequency 541. Furthermore, the impedance to a DC signal (e.g., 0 Hz) may be 0 Ohms, or close to 0 Ohms.

Figure 6:
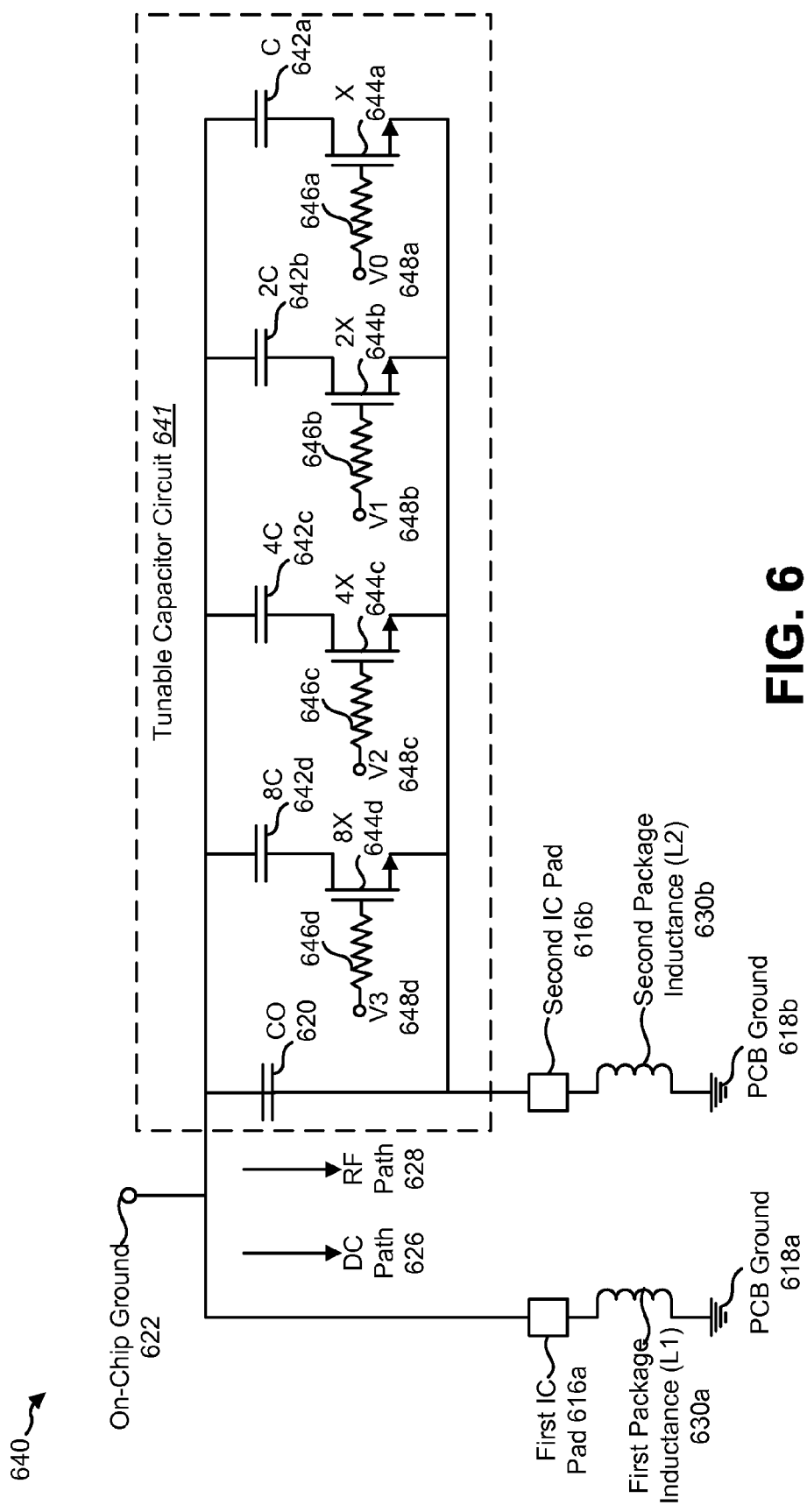
FIG. 6 is a circuit diagram illustrating a circuit that may compensate for a parasitic inductance in the connection to PCB ground.

FIG. 6 is a circuit diagram illustrating a circuit 640 that may compensate for a parasitic inductance in the connection to PCB ground 618a-b. The circuit 640 may include a direct path from an on-chip ground 622 to a first IC pad 616a and then to a PCB ground 618a, thus introducing a first package inductance (L1) 630a. The circuit 640 may also include a path that connects the on-chip ground to a second IC pad 616b through one or more capacitors, and then to the PCB ground 618b thus introducing a second package inductance (L2) 630b. The direct connection may provide a DC path 626 for the on-chip ground 622, and the connection through the capacitors may provide an RF path 628.

The circuit 640 may include a tunable capacitor circuit 641. A first capacitor (C0) 620 may be in parallel with one or more switched capacitors 642a-d in the tunable capacitor circuit 641. The first capacitor (C0) 620 may not be a switched capacitor in order to maximize the resonating quality factor. A first switched capacitor, C 642a, may be in parallel with a second switched capacitor, 2C 642b, a third switched capacitor, 4C 642c, and a fourth switched capacitor, 8C 642d, where "2C" indicates a capacitance twice as large as "C" and half as large as "4C," i.e., the value of the switched capacitors 642 may increase using binary bit incrementing. In other words, the capacitors may be linearly scaled to tune the capacitance included in the RF path 628 from C0 620 to C0+15C. Thus, the effective capacitance for the RF path 628 may be tunable.

The effective capacitance ($C_{eff}$) of the RF path 628 may be selected so that it resonates with the second package inductance (L2) 630b at the operating frequency ($w_o$), according to Equation (3):

$$C_{eff} = \frac{1}{L2 * w_0^2} \quad (3)$$

The impedance ($Z_o$) of the on-chip ground 622 may then be given according to Equation (4):

$$Z_0 = \frac{1}{\left[\frac{1}{jwL1} + \frac{1}{jwL2 + 1/jwC_{eff}}\right]} \quad (4)$$

$$= \frac{1}{\left[\frac{1}{jwL1} + \frac{1}{j(w - w_0^2/w)L2}\right]}$$

Therefore, the impedance ($Z_o$) may be zero (ideal ground), or close to zero, at the operating frequency ($w_o$). The effective capacitance ($C_{eff}$) may be tunable to account for the fact that the package inductance may not be predictable and varies with the packaging process variation. Also, the tunable capacitor circuit 641 may compensate for the IC process variation of the on-chip capacitors. To maximize the resonating quality factor, the capacitor (C0) 620 may not have a transistor switch. Furthermore, the equivalent resistance added to a circuit by a transistor may be controlled by the size of the transistor, e.g., as channel width goes up, resistance goes down. Thus, the size of the transistors 644 may be scaled together with the capacitors 642.

Each of the switched capacitors 642 may be in series with a transistor 644a-d, i.e., the first switched capacitor, C 642a, in series with a first transistor, X 644a, the second switched capacitor, 2C 642b, in series with a second transistor, 2X 644b, the third switched capacitor, 4C 642c, in series with a third transistor, 4X 644c, and the fourth switched capacitor, 8C 642d, in series with a fourth transistor, 8X 644d. As used to describe the transistors 644, the term "2X" indicates an equivalent switch-on resistance added to the circuit 540 that is twice "X" and half of "4X." The transistors 644 may be n-type metal-oxide-semiconductor (NMOS) field effect transistors. The transistors 644 may operate to include or exclude capacitance from the RF path 628 based on their respective control voltages 648a-d. Each transistor 644 may be biased using a resistor, i.e., a first resistor 646a used to bias the first transistor 644a from a first control voltage (V0) 648a, a second resistor 646b used to bias the second transistor 644b from a second control voltage (V1) 648b, a third resistor 646c used to bias the third transistor 644c from a third control voltage (V2) 648c, and a fourth resistor 646d used to bias the fourth transistor 644d from a fourth control voltage (V3) 648d. These control voltages 648a-d may be set during factory calibration or during system calibration to achieve the best performance from the circuit 640.

Figure 7:
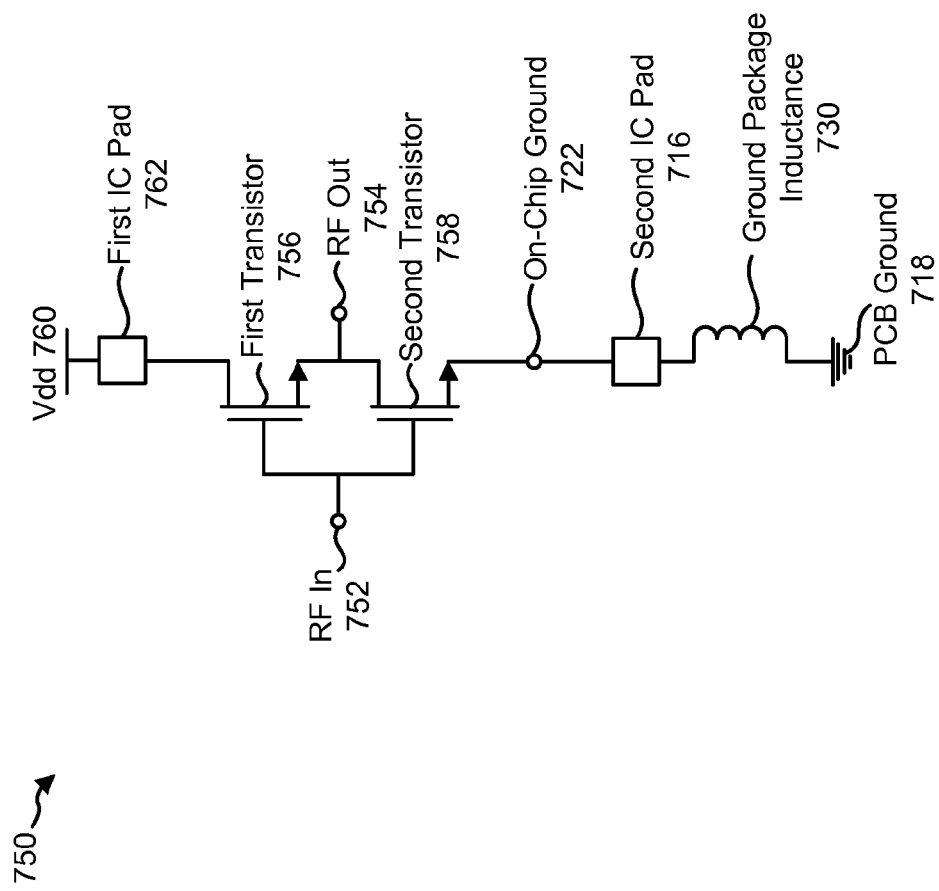
FIG. 7 is a circuit diagram illustrating an RF amplifier that may use a package inductance compensating tunable capacitor circuit.

FIG. 7 is a circuit diagram illustrating an RF amplifier 750 that may use a package inductance compensating tunable capacitor circuit 641. The RF amplifier 750 may receive an RF input signal 752 and output an RF output signal 754. The RF output signal 754 may be an amplified version of the RF input signal 752. The RF input signal 752 may be received at the gates of a first transistor 756 and a second transistor 758. The transistors may be n-type metal-oxide-semiconductor (NMOS) field effect transistors. The drain of the first transistor 756 may be connected to a first IC pad 762 that connects to a supply voltage (Vdd) 760. The source of the first transistor 756 and the drain of the second transistor 758 may be connected to produce the RF output signal 754. The source of the second transistor 758 may be connected to an on-chip ground 722 node.

The on-chip ground 722 may connect to a second IC pad 716. When the second IC pad 716 connects to the PCB ground 718, a ground package inductance 730 may be introduced to the RF amplifier 750. This ground inductance 730 may lower the power gain and the stability margin of the RF amplifier 750. Therefore, in one configuration, a tunable capacitor circuit 641 may be introduced to the RF amplifier 750 to compensate for the ground package inductance 730. This may require adding a third IC pad (not shown) that also connects to PCB ground 718 to allow for a DC path 626 and an RF path 628. The tunable capacitor circuit 641 may be tuned to include a capacitance somewhere between C0 and C0+15C. As the ground connection becomes more ideal, the impedance of the RF path 628 at an operating frequency may lower and the gain of the RF amplifier 750 may increase. Therefore, the process of tuning may include adjusting the capacitance of the tunable capacitor circuit 641 to a value that produces the highest possible gain.

Figure 8:
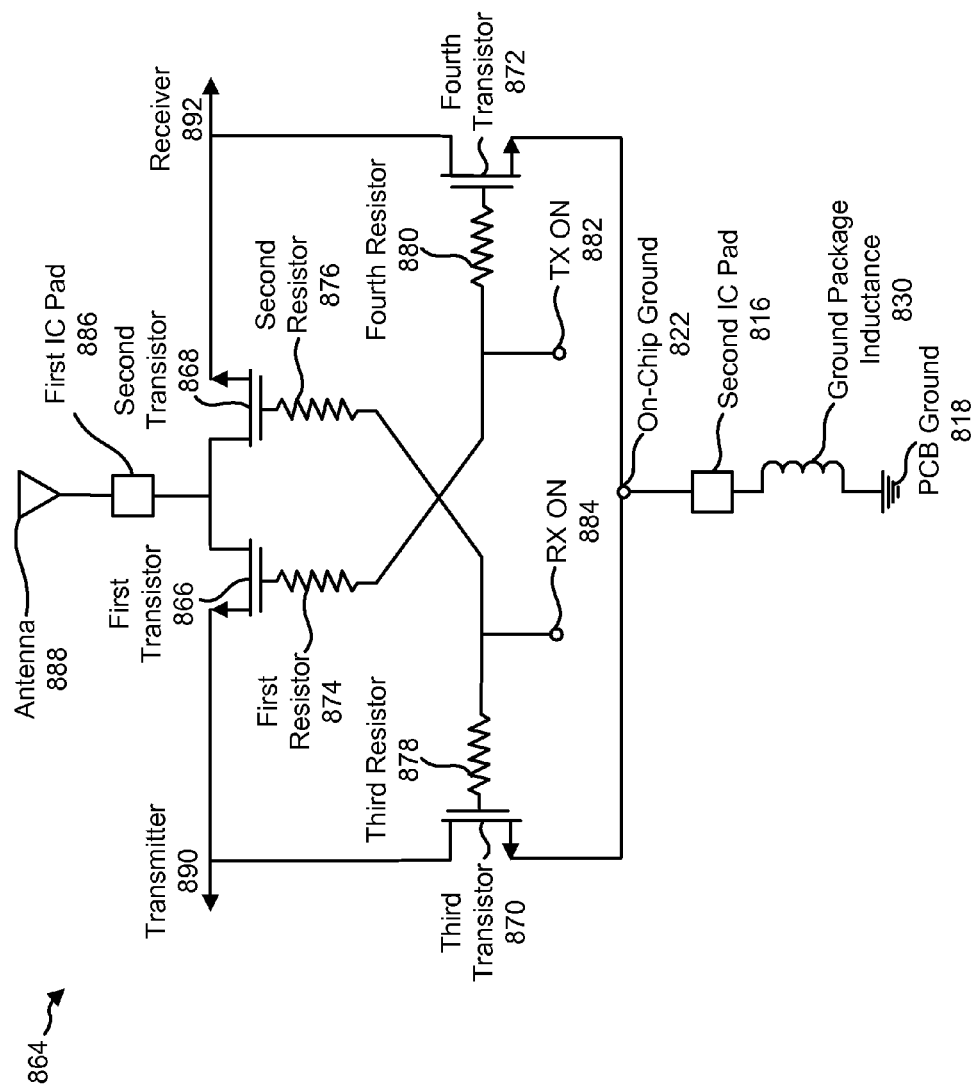
FIG. 8 is a circuit diagram illustrating a transmit/receive switch that may use a package inductance compensating tunable capacitor circuit.

FIG. 8 is a circuit diagram illustrating a transmit/receive switch 864 that may use a package inductance compensating tunable capacitor circuit 641. The switch 864 may include four transistors in a cross-coupled configuration. In one configuration, the gate of a first transistor 866 and the gate of a fourth transistor 872 may be connected to a transmit control signal 882 via a first resistor 874 and a fourth resistor 880. The gate of a second transistor 868 and the gate of a third transistor 870 may be connected to a receive control signal 884 via a second resistor 876 and a third resistor 878. The drains of the first transistor 866 and second transistor 868 may be connected to an IC pad 886 that communicates with one or more antennas 888. The source of the first transistor 866 and the drain of the third transistor 870 may communicate with a transmitter 890 while the source of the second transistor 868 and the drain of the fourth transistor 872 may communicate with a receiver 892. The source of the third transistor 870 and the fourth transistor 872 may be connected to an on-chip ground 822.

The on-chip ground 822 may connect to a second IC pad 816. When the second IC pad 816 connects to the PCB ground 818, a ground package inductance 830 may be introduced to the transmit/receive switch 864. This ground package inductance 830 may cause low RF isolation. Therefore, in one configuration, a tunable capacitor circuit 641 may be introduced to the transmit/receive switch 864 to compensate for the ground package inductance 830. This may require adding a third IC pad (not shown) that also connects to PCB ground 818 to allow for a DC path 626 and an RF path 628. The tunable capacitor circuit 641 may be tuned to include a capacitance somewhere between C0 and C0+15C. As the ground connection becomes more ideal, the impedance of the RF path 628 at an operating frequency may lower and the RF isolation in the transmit/receive switch 864 may increase. Therefore, the process of tuning may include adjusting the capacitance of the tunable capacitor circuit 641 to a value that produces the highest possible RF isolation.

Figure 9:
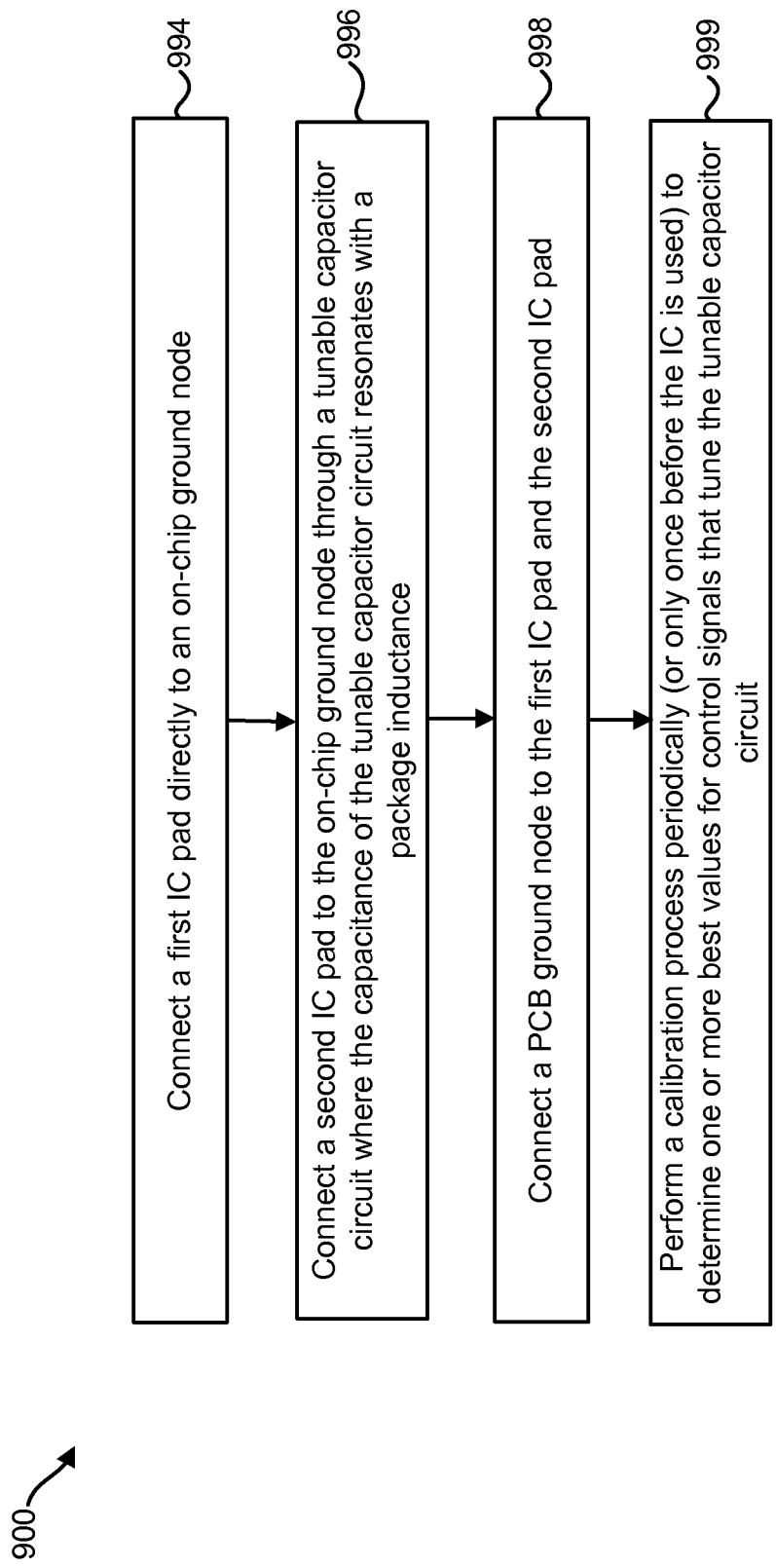
FIG. 9 is a flow diagram illustrating a method for compensating for a package inductance of an IC ground connection using an on-chip tunable capacitor circuit that resonates with the package inductance.

FIG. 9 is a flow diagram illustrating a method 900 for compensating for a package inductance of an IC ground connection using an on-chip tunable capacitor circuit 641 that resonates with the package inductance. The method 900 may be performed using the circuit 640 illustrated in FIG. 6. The circuit 640 may connect 994 a first integrated circuit (IC) pad 616a directly to an on-chip ground node 622. The circuit 640 may also connect 996 a second IC pad 616b to the on-chip ground node 622 through a tunable capacitor circuit 641. The tunable capacitor circuit 641 may be tuned using one or more control signals 648 that each control a switch, e.g., a transistor 644. The switches may operate to include a particular capacitance in the circuit 640, i.e., a capacitance between C0 and C0+15C in the RF path 628 of the circuit 640. These control signals 648 may be set during the factory calibration to get the best performance in a larger circuit, such as an RF amplifier or transmit/receive switch. Alternatively, the control signals 648 may be set during system calibration, e.g., the control signals 648 may be determined immediately before the IC is used or periodically when the IC is idle. The circuit 640 may also connect 998 a PCB ground node 618 to the first IC pad 616a (e.g., to form a DC path 626) and the second IC pad 616b (e.g., to form an RF path 628). The circuit may perform 999 a calibration process to determine one or more best values for control signals 648 that tune the tunable circuit. This calibration process may be performed 999 right before the IC is used or periodically during idle periods. In other words, the calibration may be performed at a factory before the IC is sold (factory calibration) or periodically by the user (self calibration).

Figure 10:
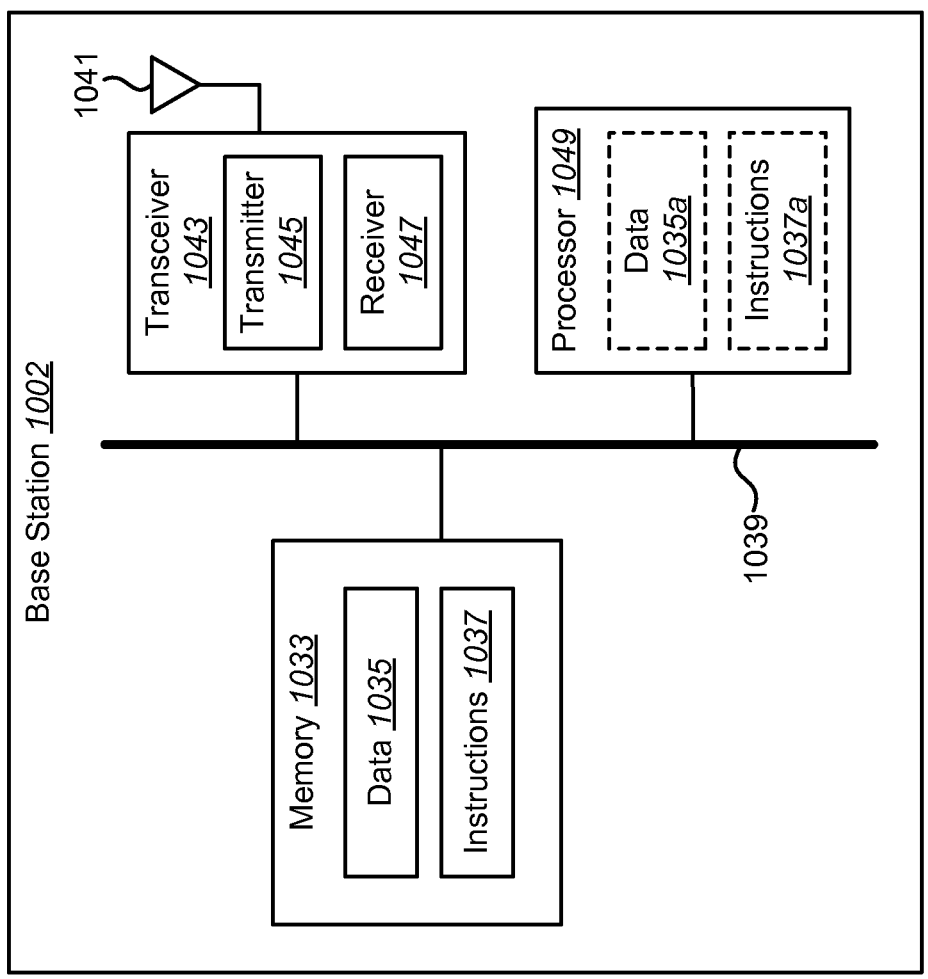
FIG. 10 illustrates certain components that may be included within base station.

FIG. 10 illustrates certain components that may be included within a base station 1002. The base station 102 or communication devices discussed previously may be configured similarly to the base station 1002 shown in FIG. 10. It should also be noted that a base station 1002 may be a communication device as termed herein.

The base station 1002 includes a processor 1049. The processor 1049 may be a general purpose single- or multi-chip microprocessor (e.g., an ARM), a special purpose microprocessor (e.g., a digital signal processor (DSP)), a microcontroller, a programmable gate array, etc. The processor 1049 may be referred to as a central processing unit (CPU). Although just a single processor 1049 is shown in the base station 1002 of FIG. 10, in an alternative configuration, a combination of processors (e.g., an ARM and DSP) could be used.

The base station 1002 also includes memory 1033 in electronic communication with the processor 1049 (i.e., the processor 1049 can read information from and/or write information to the memory 1033). The memory 1033 may be any electronic component capable of storing electronic information. The memory 1033 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1035 and instructions 1037 may be stored in the memory 1033. The instructions 1037 may include one or more programs, routines, sub-routines, functions, procedures, etc. The instructions 1037 may include a single computer-readable statement or many computer-readable statements. The instructions 1037 may be executable by the processor 1049 to implement the methods disclosed in connection with the access point 102, base station or communication device. Executing the instructions 1037 may involve the use of the data 1035 that is stored in the memory 1033. FIG. 10 shows some instructions 1037*a* and data 1035*a* being loaded into the processor 1049.

The base station 1002 may also include a transmitter 1045 and a receiver 1047 to allow transmission and reception of signals between the base station 1002 and a remote location. The transmitter 1045 and receiver 1047 may be collectively referred to as a transceiver 1043. An antenna 1041 may be electrically coupled to the transceiver 1043. The base station 1002 may also include (not shown) multiple transmitters, multiple receivers, multiple transceivers and/or multiple antenna.

The various components of the base station 1002 may be coupled together by one or more buses, which may include a power bus, a control signal bus, a status signal bus, a data bus, etc. For simplicity, the various buses are illustrated in FIG. 10 as a bus system 1039.

Figure 11:
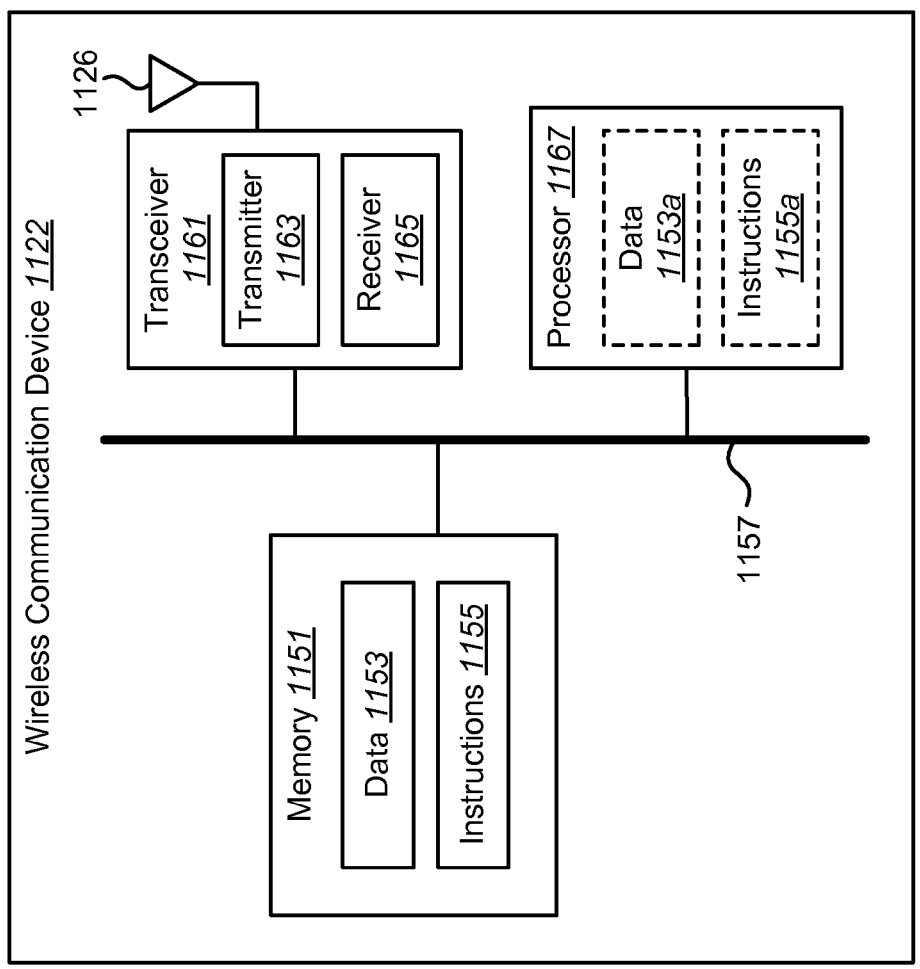
FIG. 11 illustrates certain components that may be included within a wireless communication device.

FIG. 11 illustrates certain components that may be included within a wireless communication device 1122. The wireless communication device 104 in FIG. 1 may be configured similarly to the wireless communication device 1122 that is shown in FIG. 11. Examples of wireless communication devices 1122 include cellular phones, handheld wireless devices, wireless modems, laptop computers, personal computers, etc.

The wireless communication device 1122 includes a processor 1167. The processor 1167 may be a general purpose single- or multi-chip microprocessor (e.g., an ARM), a special purpose microprocessor (e.g., a digital signal processor (DSP)), a microcontroller, a programmable gate array, etc. The processor 1167 may be referred to as a central processing unit (CPU). Although just a single processor 1167 is shown in the wireless communication device 1122 of FIG. 11, in an alternative configuration, a combination of processors (e.g., an ARM and DSP) could be used.

The wireless communication device 1122 also includes memory 1151 in electronic communication with the processor 1167 (i.e., the processor 1167 can read information from and/or write information to the memory 1151). The memory 1151 may be any electronic component capable of storing electronic information. The memory 1151 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1153 and instructions 1155 may be stored in the memory 1151. The instructions 1155 may include one or more programs, routines, sub-routines, functions, procedures, etc. The instructions 1155 may include a single computer-readable statement or many computer-readable statements. The instructions 1155 may be executable by the processor 1167 to implement the methods that were described above in connection with the wireless communication device 104. Executing the instructions 1155 may involve the use of the data 1153 that is stored in the memory 1151. FIG. 11 shows some instructions 1155*a* and data 1153*a* being loaded into the processor 1167.

The wireless communication device 1122 may also include a transmitter 1163 and a receiver 1165 to allow transmission and reception of signals between the wireless communication device 1122 and a remote location. The transmitter 1163 and receiver 1165 may be collectively referred to as a transceiver 1161. An antenna 1126 may be electrically coupled to the transceiver 1161. The wireless communication device 1122 may also include (not shown) multiple transmitters, multiple receivers, multiple transceivers and/or multiple antenna.

The various components of the wireless communication device 1122 may be coupled together by one or more buses, which may include a power bus, a control signal bus, a status signal bus, a data bus, etc. For simplicity, the various buses are illustrated in FIG. 11 as a bus system 1157.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 9 can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit (IC) for compensating for a package inductance, comprising:
    a first IC ground pad, on the IC, directly connected to an on-chip ground node; and
    a second IC ground pad connected to the on-chip ground node via a tunable capacitor circuit, wherein a capacitance of the tunable capacitor circuit resonates with a package inductance at an operating frequency of the IC.

2. The integrated circuit of claim 1, wherein a printed circuit board (PCB) ground node is connected to the first integrated circuit (IC) ground pad and the second IC ground pad, wherein the package inductance is from the connection between the second IC pad and the PCB ground node.

3. The integrated circuit of claim 2, wherein an impedance of the on-chip ground node is lower at the operating frequency of the integrated circuit when the tunable capacitor circuit resonates with the package inductance than without the tunable capacitor circuit.

4. The integrated circuit of claim 1, wherein the tunable capacitor circuit comprises a fixed capacitor in parallel with a switched capacitor.

5. The integrated circuit of claim 4, wherein the switched capacitor comprises a switch in series with a capacitor, wherein the switch operates to include or exclude a capacitance of the capacitor from the tunable capacitor circuit based on a control voltage.

6. The integrated circuit of claim 5, wherein the switch is a transistor.

7. The integrated circuit of claim 5, wherein the switch is an n-type metal-oxide-semiconductor (NMOS) field effect transistor.

8. The integrated circuit of claim 6, wherein the tunable capacitor circuit comprises a plurality of switched capacitors in parallel with each other and in parallel with the fixed capacitor.

9. The integrated circuit of claim 8, wherein a capacitance of the capacitors in the switched capacitors increase according to a binary bit increment.

10. The integrated circuit of claim 8, wherein a switch-on resistance of the transistors in the switched capacitors increases according to a binary bit increment.

11. An apparatus for compensating for a package inductance, comprising:
    a first integrated circuit (IC) ground pad, on an IC, directly connected to an on-chip ground node; and
    a second IC ground pad connected to the on-chip ground node via a tunable capacitor circuit, wherein a capacitance of the tunable capacitor circuit resonates with a package inductance at an operating frequency of the IC.

12. The apparatus of claim 11, wherein a printed circuit board (PCB) ground node is connected to the first integrated circuit (IC) ground pad and the second IC ground pad, wherein the package inductance is from the connection between the second IC pad and the PCB ground node.

13. The apparatus of claim 12, wherein an impedance of the on-chip ground node is lower at the operating frequency of the integrated circuit when the tunable capacitor circuit resonates with the package inductance than without the tunable capacitor circuit.

14. The apparatus of claim 11, wherein the tunable capacitor circuit comprises a fixed capacitor in parallel with a switched capacitor.

15. The apparatus of claim 14, wherein the switched capacitor comprises a switch in series with a capacitor, wherein the switch operates to include or exclude a capacitance of the capacitor from the tunable capacitor circuit based on a control voltage.

16. The apparatus of claim 15, wherein the switch is a transistor.

17. The apparatus of claim 15, wherein the switch is an n-type metal-oxide-semiconductor (NMOS) field effect transistor.

18. The apparatus of claim 16, wherein the tunable capacitor circuit comprises a plurality of switched capacitors in parallel with each other and in parallel with the fixed capacitor.

19. The apparatus of claim 18, wherein a capacitance of the capacitors in the switched capacitors increases according to a binary bit increment.

20. The apparatus of claim 18, wherein a switch-on resistance of the transistors in the switched capacitors increases according to a binary bit increment.

21. An apparatus for compensating for a package inductance, comprising:
a first means for connecting an integrated circuit (IC) that is directly connected to an on-chip ground node; and
a second means for connecting an IC that is connected to the on-chip ground node via a tunable capacitive means, wherein a capacitance of the tunable capacitive means resonates with a package inductance at an operating frequency of the IC.

22. The apparatus of claim 21, wherein a printed circuit board (PCB) ground node is connected to the first means for connecting and the second means for connecting, wherein the package inductance is from the connection between the second means for connecting and the PCB ground node.

23. The apparatus of claim 22, wherein an impedance of the on-chip ground node is lower at the operating frequency of the integrated circuit when the tunable capacitive means resonates with the package inductance than without the tunable capacitive means.

24. The apparatus of claim 21, wherein the tunable capacitive means comprises a fixed capacitive means in parallel with a switched capacitive means.

25. The apparatus of claim 24, wherein the switched capacitive means comprises a means for switching in series with a capacitive means, wherein the means for switching operates to include or exclude a capacitance of the capacitive means from the tunable capacitive means based on a control voltage.

26. The apparatus of claim 25, wherein the means for switching is a transistor.

27. The apparatus of claim 25, wherein the means for switching is an n-type metal-oxide-semiconductor (NMOS) field effect transistor.

28. The apparatus of claim 26, wherein the tunable capacitive means comprises a plurality of switched capacitive means in parallel with each other and in parallel with the fixed capacitive means.

29. The apparatus of claim 28, wherein a capacitance of the capacitive means in the switched capacitive means increases according to a binary bit increment.

30. The apparatus of claim 28, wherein a switch-on resistance of the transistors in the switched capacitive means increases according to a binary bit increment.

31. A method for compensating for a package inductance, comprising:
connecting a first integrated circuit (IC) pad, on an IC, directly to an on-chip ground node; and
connecting a second IC pad to the on-chip ground node via a tunable capacitor circuit, wherein a capacitance of the tunable capacitor circuit resonates with a package inductance at an operating frequency of the IC.

32. The method of claim 31, further comprising connecting a printed circuit board (PCB) ground node to the first integrated circuit (IC) ground pad and the second IC ground pad, wherein the package inductance is from the connection between the second IC pad and the PCB ground node.

33. The method of claim 32, wherein an impedance of the on-chip ground node is lower at the operating frequency of the integrated circuit when the tunable capacitor circuit resonates with the package inductance than without the tunable capacitor circuit.

34. The method of claim 31, wherein the tunable capacitor circuit comprises a fixed capacitor in parallel with a switched capacitor.

35. The method of claim 34, wherein the switched capacitor comprises a switch in series with a capacitor, wherein the switch operates to include or exclude a capacitance of the capacitor from the tunable capacitor circuit based on a control voltage.

36. The method of claim 35, wherein the switch is a transistor.

37. The method of claim 35, wherein the switch is an n-type metal-oxide-semiconductor (NMOS) field effect transistor.

38. The method of claim 36, wherein the tunable capacitor circuit comprises a plurality of switched capacitors in parallel with each other and in parallel with the fixed capacitor.

39. The method of claim 38, wherein a capacitance of the capacitors in the switched capacitors increases according to a binary bit increment.

40. The method of claim 38, wherein a switch-on resistance of the transistors in the switched capacitors increases according to a binary bit increment.

41. The method of claim 31, further comprising adjusting the capacitance of the tunable capacitor circuit to a capacitance that produces a highest possible gain in a radio frequency amplifier.

* * * * *